(12) United States Patent
Barsukou

(10) Patent No.: US 12,278,618 B2
(45) Date of Patent: Apr. 15, 2025

(54) DISPERSIVE DELAY LINE WITH LAMB WAVE PROPAGATION

(71) Applicant: Skyworks Solutions, Inc., Irvine, CA (US)

(72) Inventor: Siarhei Dmitrievich Barsukou, Takarazuka (JP)

(73) Assignee: Skyworks Solutions, Inc., Irvine, CA (US)

( * ) Notice: Subject to any disclaimer, the term of this patent is extended or adjusted under 35 U.S.C. 154(b) by 235 days.

(21) Appl. No.: 18/061,282

(22) Filed: Dec. 2, 2022

(65) Prior Publication Data

US 2023/0216484 A1 Jul. 6, 2023

Related U.S. Application Data

(60) Provisional application No. 63/408,388, filed on Sep. 20, 2022, provisional application No. 63/408,415, (Continued)

(51) Int. Cl.
*H04W 88/02* (2009.01)
*H03H 9/02* (2006.01)
(Continued)

(52) U.S. Cl.
CPC .......... *H03H 9/40* (2013.01); *H03H 9/02228* (2013.01); *H03H 9/02574* (2013.01); *H03H 9/133* (2013.01); *H03H 9/17* (2013.01); *H03H 9/36* (2013.01); *H04B 1/0053* (2013.01); *H10N 30/871* (2023.02)

(58) Field of Classification Search
CPC .. H03H 9/40; H03H 9/02228; H03H 9/02574; H03H 9/133; H03H 9/17; H03H 9/36; H10N 30/871; H04B 1/0053
See application file for complete search history.

(56) References Cited

U.S. PATENT DOCUMENTS 4,808,950 A 2/1989 Apostolos et al.
5,076,094 A * 12/1991 Frye .................... G01N 29/022
73/61.49

(Continued)

OTHER PUBLICATIONS

IP.com search history (Year: 2024).*

(Continued)

*Primary Examiner* — Moustapha Diaby
(74) *Attorney, Agent, or Firm* — Knobbe, Martens, Olson & Bear, LLP

(57) ABSTRACT

Dispersive delay lines are disclosed. The dispersive delay line can include a piezoelectric substrate having a first interdigital transducer electrode on a first region of the piezoelectric substrate and a second interdigital transducer electrode on a second region of the piezoelectric substrate. The dispersive delay line is arranged such that an acoustic wave is configured to propagate from the first interdigital transducer electrode to the second interdigital transducer electrode though a third region of the piezoelectric substrate. An additional material positioned on the third region of the piezoelectric substrate can impact acoustic wave propagation velocity. Related radio frequency modules, wireless communications devices, and methods are disclosed.

20 Claims, 9 Drawing Sheets

Related U.S. Application Data filed on Sep. 20, 2022, provisional application No. 63/408,379, filed on Sep. 20, 2022, provisional application No. 63/266,263, filed on Dec. 30, 2021.

(51) Int. Cl.

| | | |
|---|---|---|
| *H03H 9/13* | (2006.01) | |
| *H03H 9/17* | (2006.01) | |
| *H03H 9/36* | (2006.01) | |
| *H03H 9/40* | (2006.01) | |
| *H04B 1/00* | (2006.01) | |
| *H10N 30/87* | (2023.01) | |

(56) References Cited

U.S. PATENT DOCUMENTS

| | | | | |
|---|---|---|---|---|
| 2006/0255884 | A1* | 11/2006 | Tanaka | H03H 9/02228 |
| | | | | 333/195 |
| 2020/0259480 | A1* | 8/2020 | Pensala | H03H 9/13 |
| 2020/0304094 | A1* | 9/2020 | Nagatomo | H03H 9/02062 |
| 2021/0099152 | A1* | 4/2021 | Goto | H03H 9/02015 |

OTHER PUBLICATIONS

ProQuest search history (Year: 2024).*
Danicki et al., "SAW Dispersive Delay Line Utilising Apodised IDT with Periodic Electrodes", Electronics Letters, vol. 22(19): pp. 976-977, 1986.
Hsue et al., "Dispersive Delay Lines Using Microstrip Technology", The Journal of Engineering, vol. 2016(11): pp. 406-414, 2016.
Li et al., "A Compact Dispersive Delay Line Using Microstrip Lines and Opened Slot Lines", Progress in Electromagnetics Research Letters, vol. 86:7-12, 2019.
Lujambio et al., "Dispersive Delay Line with Effective Transmission-Type Operation in Coupled-Line Technology", IEEE Microwave and Wireless Components Letters, vol. 21(9): pp. 459-461, 2011.
Manzaneque et al., "An SHo Lithium Niobate Dispersive Delay Line for Chirp Compression-Enabled Low Power Radios", 2017 IEEE 30th International Conference on MEMS, Jan. 2017.
Ohtsuka et al., "High-Performance SAW Dispersive Delay Line Using Reflective Thin Metal Dot Arrays", Electronics Letters, vol. 22(12): pp. 653-654, 1986.

* cited by examiner

H2 = 0.16λ – NO GROUP DELAY DISPERSION
H2 = 0.3λ – NO GROUP DELAY DISPERSION
H2 = 0.4λ – GROUP DELAY DISPERSION

DISPERSIVE DELAY LINE WITH LAMB WAVE PROPAGATION

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/266,263, filed Dec. 30, 2021 and titled "DISPERSIVE DELAY LINE," the disclosure of which is hereby incorporated by reference in its entirety and for all purposes. This application claims the benefit of priority of U.S. Provisional Application No. 63/408,379, filed Sep. 20, 2022 and titled "DISPERSIVE DELAY LINE WITH PIEZOELECTRIC SUBSTRATE," the disclosure of which is hereby incorporated by reference in its entirety and for all purposes. This application claims the benefit of priority of U.S. Provisional Application No. 63/408,415, filed Sep. 20, 2022 and titled "DISPERSIVE DELAY LINE WITH PIEZOELECTRIC SUBSTRATE AND LAMB WAVE PROPAGATION," the disclosure of which is hereby incorporated by reference in its entirety and for all purposes. This application claims the benefit of priority of U.S. Provisional Application No. 63/408,388, filed Sep. 20, 2022 and titled "DISPERSIVE DELAY LINE WITH LAMB WAVE PROPAGATION," the disclosure of which is hereby incorporated by reference in its entirety and for all purposes.

BACKGROUND

Technical Field

Embodiments of this disclosure relate to delay lines. More specifically, embodiments disclosed herein relate to dispersive delay lines with Lamb wave propagation.

Description of Related Technology

Delay lines including acoustic wave devices can be implemented in radio frequency electronic systems. For instance, a radio frequency front end of a mobile phone can include one or more delay lines that include acoustic wave devices. A delay line can include interdigital transducer electrodes on a piezoelectric substrate. Example delay lines include Lamb wave delay lines and Rayleigh delay lines.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a dispersive delay line that includes a piezoelectric substrate, a first interdigital transducer electrode, and a second interdigital transducer electrode. The piezoelectric substrate includes a first region, a second region, and a third region. The first interdigital transducer electrode is on the first region of the piezoelectric substrate. The second interdigital transducer electrode is on the second region of the piezoelectric substrate. The dispersive delay line is arranged such that a Lamb wave is configured to propagate from the first interdigital transducer electrode to the second interdigital transducer electrode though the third region of the piezoelectric substrate with a group delay that depends on frequency.

The Lamb wave can have a wavelength of $\lambda$, and the third region of the piezoelectric substrate can have a thickness that is less than $0.5\lambda$. The third region of the piezoelectric substrate can have a thickness that is greater than a thicknesses of the first region and that is greater than a thickness of the second region.

The group delay can have linear relationship with frequency. The group delay can have a non-linear relationship with frequency.

The piezoelectric substrate can have stepped heights in the third region.

The dispersive delay line can include additional material on the third region of the piezoelectric substrate, where the additional material is configured to adjust acoustic wave propagation in the third region.

The dispersive delay line can have a passband bandwidth in a range from 0.5 gigahertz to 2 gigahertz. The dispersive delay line can have a passband bandwidth of more than 1 gigahertz.

The dispersive delay line can have a group delay in a range from 20 nanoseconds to 100 nanoseconds. The dispersive delay line can have a group delay in a range from 25 nanoseconds to 50 nanoseconds.

The dispersive delay line can have an operating frequency in range from 5 gigahertz to 10 gigahertz. The dispersive delay line can have an operating frequency of more than 10 gigahertz. The dispersive delay line can have an operating frequency in Frequency Range 2 defined by a New Radio standard.

The piezoelectric substrate can include aluminum nitride. The Lamb wave can be a lowest order symmetric mode Lamb wave.

Another aspect of this disclosure is a dispersive delay line that includes a piezoelectric substrate, a first interdigital transducer electrode, and a second interdigital transducer electrode. The piezoelectric substrate includes a first region, a second region, and a third region. The first interdigital transducer electrode is on the first region of the piezoelectric substrate. The second interdigital transducer electrode is on the second region of the piezoelectric substrate. The dispersive delay line is arranged such that a Lamb wave having a wavelength of $\lambda$ is configured to propagate from the first interdigital transducer electrode to the second interdigital transducer electrode though the third region of the piezoelectric substrate. The third region of the piezoelectric substrate has a thickness that is less than $0.5\lambda$ and that is greater than a thickness of the first region of the piezoelectric substrate.

The piezoelectric substrate can include aluminum nitride. The Lamb wave can be a lowest order symmetric mode Lamb wave.

The dispersive delay line can have a passband of more than 0.5 gigahertz. The passband can be less than 2 gigahertz. The dispersive delay line can have a passband of more than 1 gigahertz.

The dispersive delay line can have a group delay in a range from 25 nanoseconds to 50 nanoseconds. The dispersive delay line can have a group delay in a range from 20 nanoseconds to 100 nanoseconds. The dispersive delay line can have a group delay in a range from 20 nanoseconds to 150 nanoseconds.

The dispersive delay line can have an operating frequency in range from 5 gigahertz to 10 gigahertz. The dispersive delay line can have an operating frequency of more than 10 gigahertz. The dispersive delay line can have an operating frequency in Frequency Range 2 defined by a New Radio standard.

The dispersive delay line can include additional material positioned on at least one of a top surface or a bottom surface of the piezoelectric substrate in the third region. The additional material can include at least one of silicon dioxide, gallium nitride, or silicon nitride.

The thickness of the third region of the piezoelectric substrate can decrease adjacent to the first region and adjacent to the second region.

A first thickness of the piezoelectric substrate adjacent a first end of the third region proximal to the first interdigital transducer can be less than $0.5\lambda$, and a second thickness of the piezoelectric substrate adjacent a second end of the third region proximal to the second interdigital transducer electrode can be less than the first thickness of the piezoelectric substrate.

The thickness of the piezoelectric substrate in the third region can be scaled linearly between the first thickness and the second thickness. The thickness of the piezoelectric substrate in the third region can be scaled non-linearly between the first thickness and the second thickness.

A first thickness of the piezoelectric substrate adjacent a first end of the third region proximal to the first interdigital transducer can be less than $0.5\lambda$, a second thickness of the piezoelectric substrate adjacent a second end of the third region proximal to the second interdigital transducer electrode can be less than or equal to the first thickness of the piezoelectric substrate, and a third thickness of the piezoelectric substrate at a narrowed portion of the piezoelectric substrate located between the first and second ends in the third region can be less than the second thickness. The third thickness of the piezoelectric substrate can be greater than or equal to a thickness of the piezoelectric substrate in the first region.

Another aspect of this disclosure is a dispersive delay line that includes a piezoelectric substrate, a first interdigital transducer electrode, a second interdigital transducer electrode, and additional material. The piezoelectric substrate includes a first region, a second region, and a third region. The first interdigital transducer electrode is on the first region of the piezoelectric substrate. The second interdigital transducer electrode is on the second region of the piezoelectric substrate. The additional material is on the third region of the piezoelectric substrate. The additional material is configured to adjust acoustic wave propagation velocity in the third region of the piezoelectric substrate. The dispersive delay line is arranged such that a Lamb wave of wavelength $\lambda$ is configured to propagate from the first interdigital transducer electrode to the second interdigital transducer electrode though the third region of the piezoelectric substrate with a group delay that depends on frequency.

The additional material can be positioned on both a top surface and a bottom surface of the piezoelectric substrate in the third region.

The additional material can include silicon dioxide. The additional material can include gallium nitride. The additional material can include silicon nitride.

The piezoelectric substrate can have a substantially constant thickness in the first region, the second region, and the third region.

The group delay can have a linear relationship with frequency. The group delay can have a non-linear relationship with frequency.

The dispersive delay line can have a passband bandwidth in a range from 0.5 gigahertz to 2 gigahertz. The dispersive delay line can have a passband bandwidth of more than 1 gigahertz.

The group delay can be in a range from 20 nanoseconds to 100 nanoseconds.

The dispersive delay line can have an operating frequency in range from 5 gigahertz to 10 gigahertz. The dispersive delay line can have an operating frequency in Frequency Range 2 defined by a New Radio standard.

The piezoelectric substrate can include aluminum nitride. The Lamb wave can be a lowest order symmetric mode Lamb wave.

Another aspect of this disclosure is a radio frequency module that includes a dispersive delay line in accordance with any suitable principles and advantages disclosed herein, radio frequency circuitry coupled to the dispersive delay line, and a packaging structure enclosing the dispersive delay line and the radio frequency circuitry.

Another aspect of this disclosure is a wireless communication device including a that includes a dispersive delay line in accordance with any suitable principles and advantages disclosed herein and an antenna in communication with the dispersive delay line.

Another aspect of this disclosure is a method of radio frequency signal processing. The method includes providing a dispersive delay line in accordance with any suitable principles and advantages disclosed herein, and frequency modulating a radio frequency signal with the dispersive delay line.

Another aspect of this disclosure is a method of radio frequency signal processing. The method includes providing a dispersive delay line in accordance with any suitable principles and advantages disclosed herein, and frequency demodulating a radio frequency signal with the dispersive delay line.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 18/061,093, titled "DISPERSIVE DELAY LINE WITH PIEZOELECTRIC SUBSTRATE," filed on even date herewith, the entire disclosure of which is hereby incorporated by reference herein. The present disclosure relates to U.S. patent application Ser. No. 18/061,185, titled "DISPERSIVE DELAY LINE WITH PIEZOELECTRIC SUBSTRATE AND LAMB WAVE PROPAGATION," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
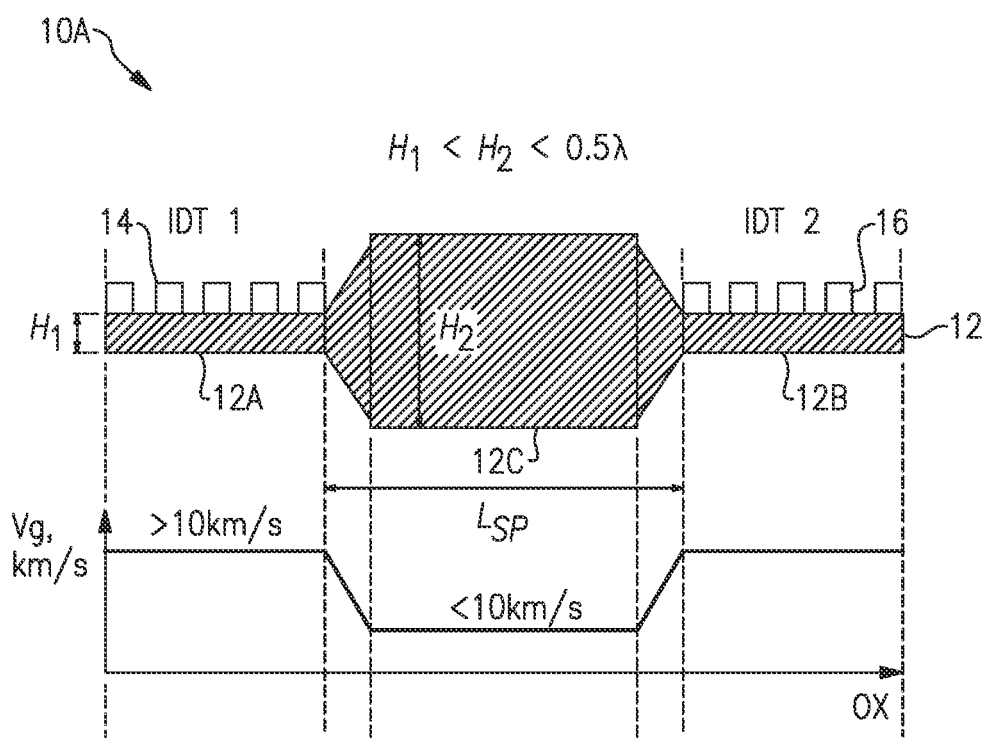
FIG. 1A illustrates a schematic cross-sectional diagram of a dispersive delay line according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A dispersive delay line (DDL) can be utilized for passive formation and compression of frequency-modulated (FM) signals. In certain applications, the FM signals can have a frequency in Frequency Range 1 (RF1) as defined by a New Radio (NR) standard. A DLL can enable setting both linear and non-linear frequency modulation. A DLL can provide positive or negative slopes of the dispersion characteristic. DLLs disclosed herein can achieve high dispersion of group velocity of a Lamb wave. A time delay of about 100 nanoseconds can be achieved with low acoustic damping with a DLL according to an embodiment.

A DLL can be used to compress an FM signal. The compression coefficient, which can be a product of the duration of the FM signal by the passband, can reach 100. A DLL can also modulate and/or demodulate an FM signal.

A DLL can include a first interdigital transducer electrode and a second interdigital transducer electrode on a piezoelectric substrate. In certain embodiments, one or more thicker parts of the piezoelectric substrate between the parts of the piezoelectric substrate on which the first and second interdigital transducer electrodes are positioned can function as a waveguide for a Lamb wave having a wavelength of $\lambda$ and propagating between the first and second interdigital transducer electrodes. The thicker part of the piezoelectric substrate can have a thickness that is of less than $0.5\lambda$ and that is greater than the parts of the piezoelectric substrate under the first and second interdigital transducer electrodes. The piezoelectric substrate can be an aluminum nitride (AlN) piezoelectric substrate. The Lamb wave can be a S0 symmetrical mode Lamb wave. An S0 symmetrical mode Lamb wave is a lowest order symmetric mode Lamb wave. The dispersive delay line provides dispersion over a passband. With the dispersive delay line, group delay is adjusted over frequency. The passband can be relatively wide, such as at least about 1 gigahertz (GHz).

DLLs are disclosed with a velocity dispersed thin plate waveguide at high order S0 symmetrical Lamb wave mode. DLLs disclosed herein can achieve a high delay time. This can be a result of the relatively lower velocity of the Lamb wave in solids. DLLs disclosed herein can have a high working frequency suitable for Fifth Generation (5G) NR applications, such as applications over 10 GHz. DLLs disclosed herein can have a wide frequency range, such as a frequency range of over 1 GHz. DLLs disclosed herein can have low losses. This can result from relatively low acoustical dumping in a thin plate Lamb wave device. DLLs disclosed herein can have a controllable dispersion characteristic. The dispersion characteristic can be controllable via thickness of the waveguide of the DLL.

Embodiments of DLLs will now be discussed. A DLL can be implemented in accordance with any suitable principles and advantages of the embodiments of the DLLs disclosed herein.

FIG. 1A illustrates a schematic cross-sectional diagram of a DLL 10A according to an embodiment. The DLL 10A has a velocity dispersed thin plate waveguide at zero order S0 symmetrical Lamb wave regime. The dispersion achievable is the difference in group velocity of the S0 Lamb wave in the thin plate with different thicknesses of the waveguide. The DLL 10A can adjust group delay for different frequencies in its passband. As will be discussed herein with reference to FIGS. 2B and 2C, a DLL can have a nonlinear group delay or a linearized group delay over some or all of the passband. For example, the DLL 10A can have a nonlinear group delay in the passband. The DLL 10A can have a relatively high operating frequency. In certain applications, the operating frequency can be in a range from 5 GHz to 10 GHz, above 10 GHz, in a range from 10 GHz to 20 GHz, above 20 GHz, or in Frequency Range 2 (FR2) as defined by a NR standard.

As shown in FIG. 1A, the DLL 10A includes a piezoelectric substrate 12 and a plurality of interdigital transducer (IDT) electrodes 14 and 16 on the piezoelectric substrate 12. The piezoelectric substrate 12 can be an aluminum nitride piezoelectric substrate or any other suitable piezoelectric substrate. Aluminum nitride piezoelectric substrates can be useful in certain high frequency applications. The piezoelectric substrate 12 can be a doped. For example, the piezoelectric substrate 12 can be an aluminum nitride piezoelectric substrate doped with scandium. Accordingly, a piezoelectric substrate that includes aluminum nitride can also include a dopant.

The piezoelectric substrate 12 has a thickness of $H_1$ in regions 12A and 12B under the IDT electrodes 14 and 16, respectively. The regions 12A and 12B of the piezoelectric substrate 12 under the IDT electrodes 14 and 16 can be referred to as thin plate regions. The piezoelectric substrate 12 has a thickness $H_2$ in a region 12C between the thin plate regions 12A and 12B. The region 12C can function as a waveguide. The majority of the region 12C can have the thickness $H_2$, and thickness in the region 12C can decrease adjacent to the regions 12A and 12B. For example, as shown in FIG. 1A, thickness can linearly decrease from $H_2$ to $H_1$ in areas of the region 12B adjacent to the regions 12A and 12B. In some other applications, the region 12C can have a substantially constant thickness.

The IDT electrode 14 and the region 12A of the piezoelectric substrate 12 are included in a Lamb wave element that can generate a Lamb wave. The IDT electrode 14 can excite a S0 zero order symmetrical Lamb wave having a wavelength of $\lambda$. The S0 zero order symmetrical Lamb can propagate through the waveguide to the IDT electrode 16. The thickness $H_1$ of the thin plate regions 12A and 12B can be in a range from $0.1\lambda$ to $0.5\lambda$, for example. For instance, the thickness $H_1$ can be $0.3\lambda$ in certain applications. As illustrated in FIG. 1A, the thin plate regions 12A and 12B can have the same thickness $H_1$. The thickness $H_2$ of the piezoelectric substrate 12 in region 12C is greater than the thickness $H_1$ in regions 12A and 12B in certain applications. In certain embodiments, the thickness $H_2$ can be less than $0.5\lambda$. The IDT electrodes 14 and 16 are spaced apart by a distance of $L_{SP}$. As will be discussed in greater detail herein, a profile of one or more waveguide regions (such as, the region 12C) can have a varied thickness and/or a shorter length to reduce losses incurred by the DLL 10A for Lamb waves of various wavelengths.

The bottom of FIG. 1A shows a group delay velocity Vg distribution for the different regions of the piezoelectric substrate 12. The group delay velocity Vg is smaller in the waveguide region 12C than in the regions 12A and 12B. For example, the group delay velocity Vg can be less than 10 km/s in the region 12C and greater than 10 km/s in the regions 12A and 12B. The group delay time can depend on the length $L_{SP}$ between the IDT electrodes 14 and 16, and the length and physical profile of the waveguide region 12C. In certain applications, the group delay can be in a range from 25 nanoseconds (ns) to 50 ns, in a range from 20 ns to 100 ns, or in a range from 20 ns to 150 ns.

The piezoelectric substrate 12 can be manufactured in a variety of different ways. In certain instances, a piezoelectric substrate of thickness $H_2$ can be removed (e.g., etched) in regions 12A and 12B to reduce to thickness $H_1$ in those regions. In some instances, piezoelectric material can be deposited (e.g., sputtered) over region 12C of a piezoelectric substrate of thickness $H_1$ to increase the thickness in region 12C to $H_2$. The piezoelectric substrate can be manufactured by stepped sputtering and etching in various applications.

Figure 1B:
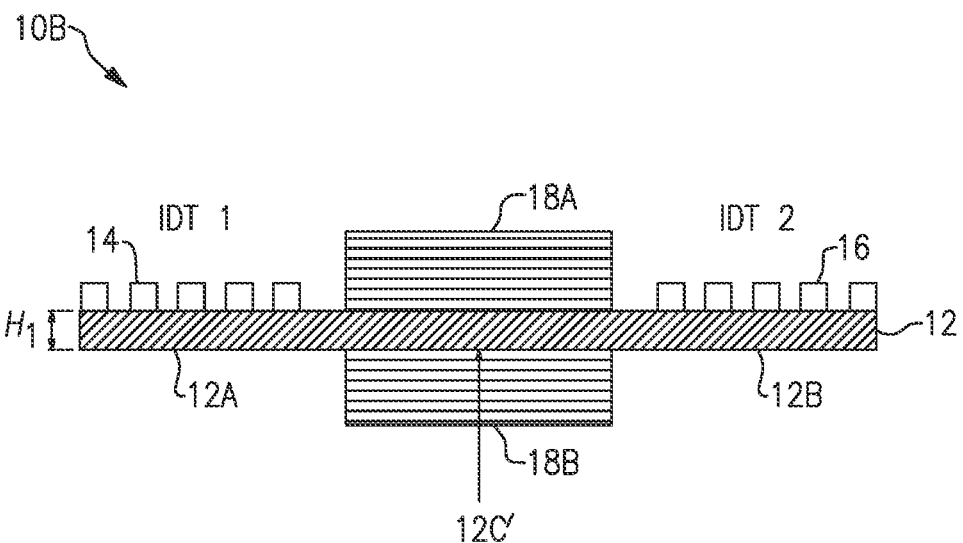
FIG. 1B illustrates a schematic cross-sectional diagram of a dispersive delay line according to another embodiment.

In another embodiment, for example as shown in FIG. 1B, a DLL 10B can have a piezoelectric substrate 12 of consistent thickness $H_1$ throughout. In FIG. 1B, the piezoelectric substrate 12 has a substantially constant thickness. A first layer 18A and a second layer 18B of additional material can be included on opposing sides of the piezoelectric substrate 12 in the waveguide region 12C'. In some other applications, additional material can be included on one side of the piezoelectric substrate 12 in the waveguide region 12C'. The additional material can include, for example, one or more of silicon dioxide, gallium nitride, silicon nitride, or any other suitable material. The additional material can provide different acoustic impedance of the waveguide and alter the wave propagation velocity of the Lamb waves compared to the piezoelectric layer without the additional material present. The composition and dimensions of the layers 18A and 18B of additional material can be selected to achieve one or more of lower losses, longer group delays, enhanced bandwidth, or improved thermal stability of the DDL 10B.

As illustrated, the layers 18A and 18B of additional material can have substantially constant thickness. In some other applications, one or more layers of additional material can have any suitable non-constant thickness. In the DLL 10B, the combined thickness of the waveguide region 12C' of the piezoelectric substrate 12 and the layers of additional material can be less than $0.5\lambda$ and greater than the thickness $H_1$ in the region 12A.

Although additional material to adjust wave propagation velocity in a waveguide region is shown with a piezoelectric substrate 12 with substantially constant thickness in FIG. 1B, such additional material can be included in a DLL with a wave guide region of a piezoelectric substrate having varied thickness. For example, additional material can be included on some or all of at least one side of the piezoelectric substrate in a waveguide region of any of the DLLs of FIG. 1A, FIG. 1C, FIG. 1D, or FIG. 1E. Additional material can be included in combination with DLLs including any suitable combination of features disclosed herein.

Figure 1C:
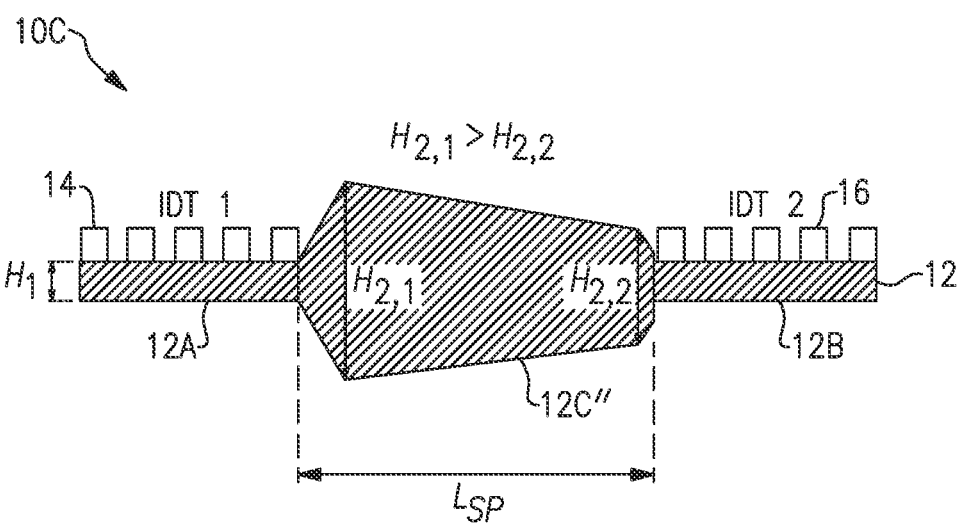
FIG. 1C illustrates a schematic cross-sectional diagram of a dispersive delay line according to another embodiment.

FIG. 1C illustrates a schematic cross-sectional diagram of a DLL 10C according to another embodiment. The DLL 10C has a velocity dispersed thin plate waveguide at zero order S0 symmetrical Lamb wave regime. Like the DLL 10A of FIG. 1A, dispersion achievable by the DLL 10C is the difference in group velocity of the S0 Lamb wave in the piezoelectric substrate 12 between the thin plate regions 12A and 12B and a waveguide region 12C". The DLL 10C can adjust group delay for different frequencies in its passband, the passband being at least partially determined by the physical profile of the waveguide region 12C".

As will be discussed herein with reference to FIG. 2C, the DLL 10C can have a linearized group delay over some or all of the passband. The DLL 10C can have a relatively high operating frequency, in some cases higher than that of the DLLL 10A of FIG. 1A. For Lamb waves in a particular range of frequencies (such as, frequencies above approximately 5 GHz), the DLL 10C can have improved performance and reduced signal losses. In certain applications, the operating frequency can be in a range from 5 GHz to 10 GHz, above 10 GHz, in a range from 10 GHz to 20 GHz, above 20 GHz, or in FR2 as defined by a NR standard.

The piezoelectric substrate 12 of the DLL 10C can be an aluminum nitride piezoelectric substrate or any other suitable piezoelectric substrate. The piezoelectric substrate 12 has a thickness of $H_1$ in the thin plate regions 12A and 12B underneath the IDT electrodes 14 and 16, respectively. In the centrally-located waveguide region 12C", the piezoelectric substrate 12 has a varying thickness that decreases between the thin plate region 12A and the thin plate region 12B. In the waveguide region 12C", the piezoelectric substrate 12 has a first thickness $H_{2,1}$ proximal to the thin plate region 12A Proximal to the thin plate region 12B, the piezoelectric substrate 12 has a second thickness $H_{2,2}$, which is smaller than $H_{2,1}$.

As shown by FIG. 1C, the profile of the piezoelectric substrate 12 in the waveguide region 12C" can scale linearly between the first thickness $H_{2,1}$ and the second thickness $H_{2,2}$. In some other embodiments, the profile of the piezoelectric substrate 12 may scale according to any suitable non-linear tapering function (for example, exponentially or quadratically). In an additional embodiment, the second thickness $H_{2,2}$ can be equivalent to the thickness $H_1$ of the thin plate region 12B, causing the waveguide region 12C" to transition smoothly from the first thickness $H_{2,1}$ into the thin plate region.

When excitation of a S0 zero order symmetrical Lamb wave by the IDT electrode 14 occurs, the Lamb wave can propagate through the waveguide to the IDT electrode 16 in the DLL 10C. The first thickness $H_{2,1}$ and the second thickness $H_{2,2}$ of the piezoelectric substrate 12 in the waveguide region 12C'' are preferably greater than the thickness $H_1$ in regions 12A and 12B. In certain embodiments, the first thickness $H_{2,1}$ and/or the second thickness $H_{2,2}$ can be less than 0.5λ. The IDT electrodes 14 and 16 are spaced apart from each other by a distance of $L_{SP}$. By scaling the profile of the piezoelectric substrate 12 in the waveguide region 12C'', the group delay velocity Vg of the Lamb wave can be gradually increased between the first end and the second end of the waveguide region 12C''. For example, the group delay velocity Vg can be less than 10 km/s at the first end of the waveguide region 12C'', and greater than 10 km/s approaching the second end in the waveguide region and in the regions 12A and 12B. The group delay time can depend at least in part on the length $L_{SP}$ as well as the scaling and profile of the piezoelectric substrate 12 in the waveguide region 12C''.

A DLL can include a stepped waveguide structure to achieve a particular group delay distribution along a passband. Example DLLs with stepped waveguide structures will be discussed with reference to FIGS. 1D and 1E.

Figure 1D:
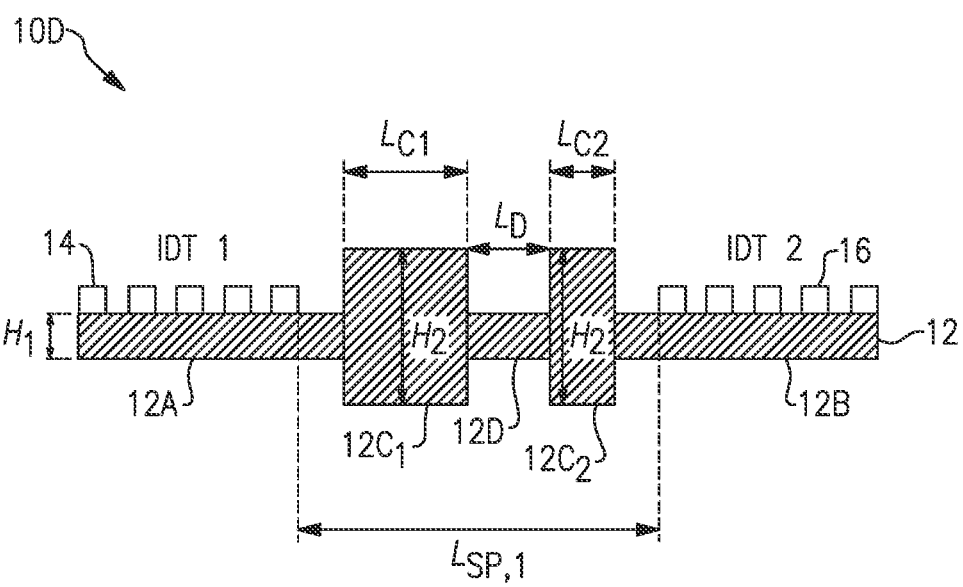
FIG. 1D illustrates a schematic cross-sectional diagram of a dispersive delay line according to yet another embodiment.

FIG. 1D illustrates a schematic cross-sectional diagram of a DLL 10D according to another embodiment. The DLL 10D has a pair of velocity dispersed thin plate waveguides at zero order S0 symmetrical Lamb wave regime. Dispersion achievable by the DLL 10D is the difference in group velocity of the S0 Lamb wave in the piezoelectric substrate 12 between the thin plate regions 12A and 12B and a pair of stepped waveguide regions $12C_1$ and $12C_2$. The DLL 10D can adjust group delay for different frequencies in its passband, the passband being at least partially determined by the physical profile of the waveguide regions $12C_1$ and $12C_2$.

The DLL 10D can have a relatively high operating frequency, in some cases higher than those of the embodiments of FIG. 1A or 1C. For Lamb waves in a particular range of frequencies (such as, frequencies above approximately 5 GHz), the DLL 10D can have improved performance and reduced signal losses. In certain applications, the operating frequency can be in a range from 5 GHz to 10 GHz, above 10 GHz, in a range from 10 GHz to 20 GHz, above 20 GHz, or in FR2 as defined by a NR standard.

The piezoelectric substrate 12 of the DLL 10D can be an aluminum nitride piezoelectric substrate or any suitable piezoelectric substrate. The piezoelectric substrate 12 has a thickness of $H_1$ in the thin plate regions 12A and 12B underneath the IDT electrodes 14 and 16, respectively. In this embodiment, the piezoelectric substrate 12 has a thickness $H_2$ in the pair of stepped waveguide regions $12C_1$ and $12C_2$ centrally located between the thin plate regions. In certain applications, there can be three or more stepped waveguide regions located between the thin plate regions. As shown in FIG. 1D, the waveguide regions $12C_1$ and $12C_2$ each have a length $L_{C1}$ and $L_{C2}$, respectively. The length $L_{C1}$ is preferably greater than $L_{C2}$, but in some cases the lengths can be equal. The waveguide regions $12C_1$ and $12C_2$ are separated by a narrowed region 12D of length $L_D$, where the piezoelectric substrate 12 has the same or a similar thickness to $H_1$. In certain embodiments, the piezoelectric substrate 12 can have an intermediate thickness in a range between $H_1$ and $H_2$ in narrowed region 12D. The sum of the lengths $L_{C1}$, $L_{C2}$, and $L_D$ is less than or equal to the distance $L_{SP}$ between the IDT electrodes 14 and 16.

When excitation of a S0 zero order symmetrical Lamb wave by the IDT electrode 14 occurs, the Lamb wave can propagate through the waveguides to the IDT electrodes 16. In certain embodiments, the thickness $H_2$ can be less than 0.5λ. The group delay velocity Vg of the Lamb wave can be reduced, increased, and reduced again by the waveguide regions $12C_1$ and $12C_2$ and the narrowed region 12D to achieve a specific group delay distribution over the pass band of the waveguides. The group delay time can depend at least in part on the lengths $L_{SP}$, $L_{C1}$, $L_{C2}$, and $L_D$, as well as the profile of the piezoelectric substrate 12 in each of the waveguide regions $12C_1$ and $12C_2$.

Figure 1E:
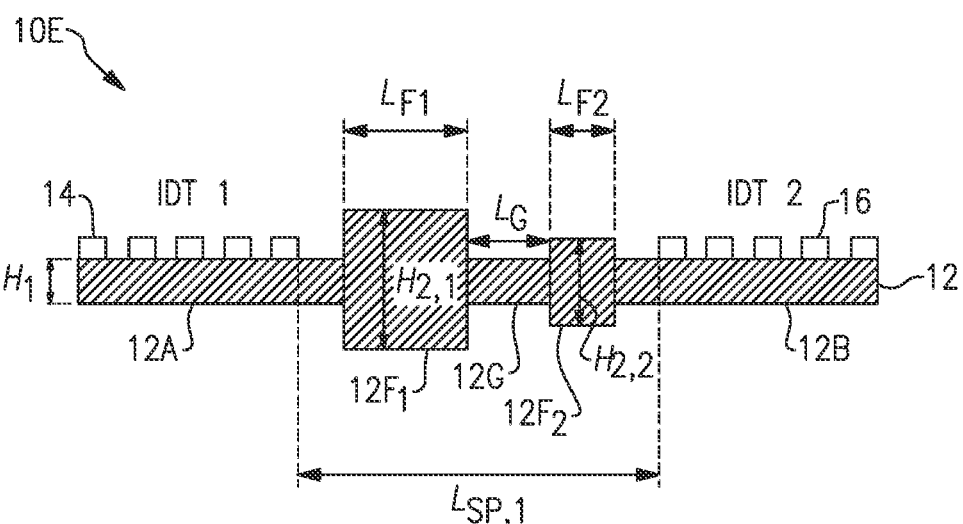
FIG. 1E illustrates a schematic cross-sectional diagram of a dispersive delay line according to an additional embodiment.

FIG. 1E illustrates a schematic cross-sectional diagram of a DLL 10E according to an another embodiment. The piezoelectric substrate 12 has a thickness of $H_1$ in the thin plate regions 12A and 12B underneath the IDT electrodes 14 and 16, respectively. Compared to the DLL 10D of FIG. 1D, in this embodiment, the piezoelectric substrate 12 has a first thickness $H_{2,1}$ in a first one of a pair of complementary waveguide regions $12F_1$, and a second thickness $H_{2,2}$ in a second one of the pair of complementary waveguide regions $12F_2$.

Both waveguide regions $12F_1$ and $12F_2$ are centrally located between the thin plate regions 12A and 12D. The waveguide regions $12F_1$ and $12F_2$ are separated by a narrowed region 12G of length $L_G$, where the piezoelectric substrate 12 has the same or a similar thickness to $H_1$. In certain embodiments, the piezoelectric substrate 12 can have an intermediate thickness in a range between $H_1$ and $H_{2,2}$ in the narrowed region 12G. In certain applications, there can be three or more distinct waveguide regions $12F_n$ located between the thin plate regions, each waveguide region having a corresponding thickness $H_n$ and separated by two or more narrowed regions $12G_{n-1}$.

When excitation of a S0 zero order symmetrical Lamb wave by the IDT electrode 14 occurs, the Lamb wave can propagate through the waveguides to the IDT electrode 16. In certain embodiments, the first thickness $H_{2,1}$ can be less than 0.5λ, and preferably greater than the second thickness $H_{2,2}$, causing a greater reduction in group delay velocity Vg as a Lamb wave passes through the first waveguide region $12F_1$. The group delay velocity Vg of the Lamb wave can be reduced, increased, and reduced again by the waveguide regions $12F_1$ and $12F_2$ and the narrowed region 12G. The lengths $L_{SP}$, LH, $L_{F2}$, and $L_G$ of the various regions of the piezoelectric substrate 12 can also be selected to adjust the group delay time and characteristics (such as linearity) of the DLL 10.

Figure 2A:
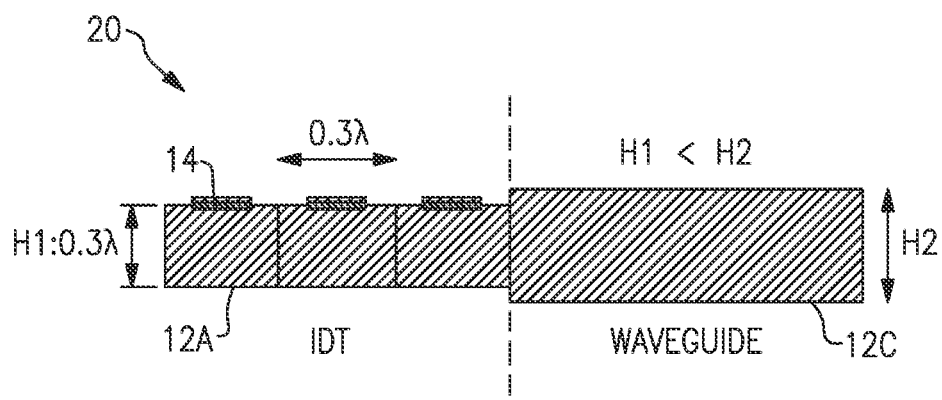
FIG. 2A illustrates a schematic cross-sectional diagram of a part of a dispersive delay line according to an embodiment.

FIG. 2A illustrates a schematic cross-sectional diagram of a part of a DLL 20 according to an embodiment. In the DLL 20, region 12A of the piezoelectric substrate has a thickness of 0.3λ and region 12C of the piezoelectric substrate has thickness of greater than 0.3λ, such as 0.4λ.

Figure 2B:
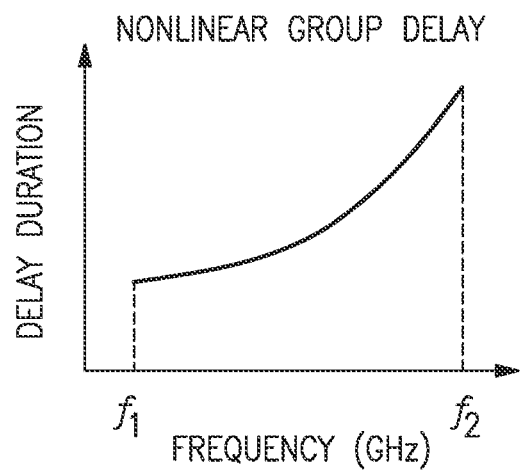
FIG. 2B is a graph that illustrates a non-linearized group delay for a dispersive delay line according embodiments.

FIG. 2B is a graph that illustrates a non-linearized group delay for a DLL, such as the DLLs 10A and 20 of FIGS. 1A and 2A, respectively. In FIG. 2B, delay duration increases non-linearly with frequency. Between a first passband frequency $f_1$ and a second passband frequency $f_2$, group delay duration rises substantially nonlinearly over some or all of the passband. In certain embodiments, group delay can be linear for a specific frequency range within the passband and nonlinear outside of the range. The group delay is said to be non-linearized because the physical profile, length, and composition of the DLLs 10A and 20 have not been configured to produce a substantially linear group delay.

Figure 2C:
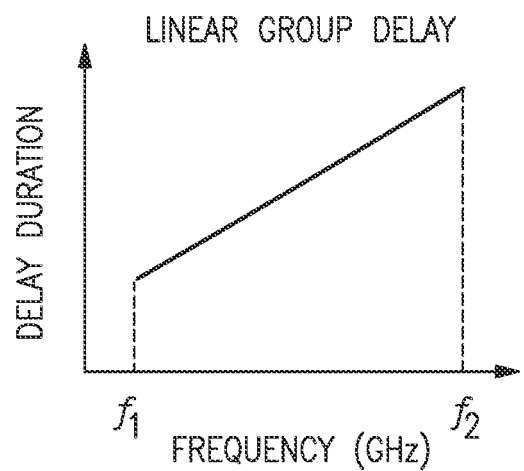
FIG. 2C is a graph that illustrates a linearized group delay for a dispersive delay line according embodiments.

FIG. 2C is a graph that illustrates a linearized group delay for a DLL, such as the DLL 10C of FIG. 1C. In FIG. 2C, delay duration increases linearly with frequency. Due to the decreasing thickness of the piezoelectric substrate 12 over the waveguide region 12C" in the DLL 10C, the group delay duration for the DLL 10C rises substantially linearly between the first passband frequency $f_1$ and the second passband frequency $f_2$. In certain embodiments, group delay can be linear for a specific frequency range within the passband and nonlinear outside of the range.

Figure 3A:
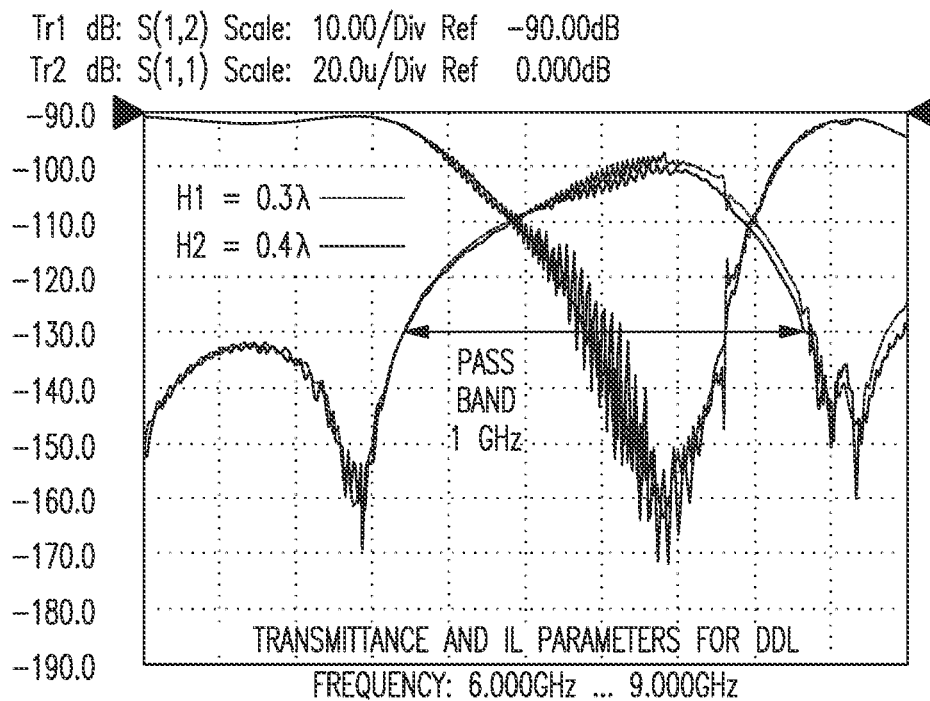
FIGS. 3A and 3B are graphs associated with simulations of a dispersive delay line according to an embodiment and a conventional delay line.
Figure 3B:
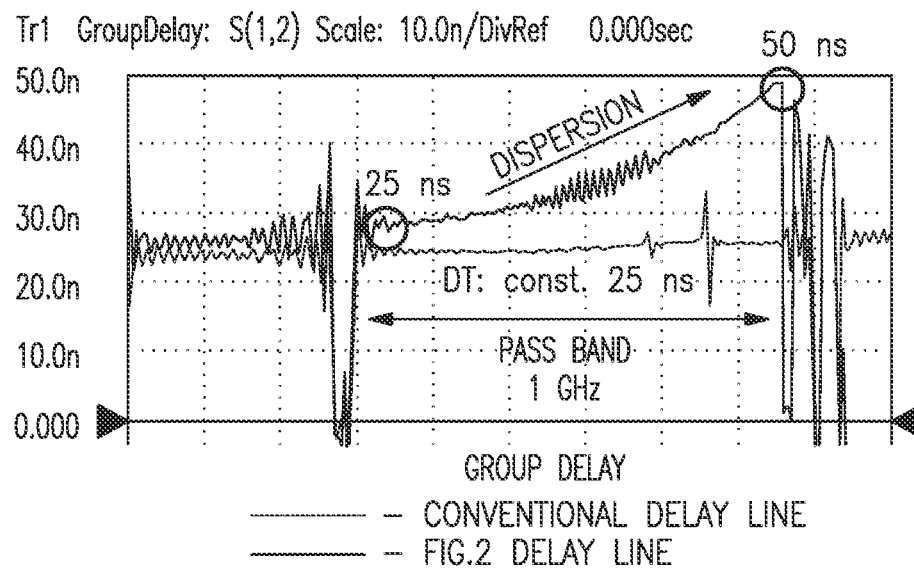

FIGS. 3A and 3B are graphs associated with simulations of the DLL 20 of FIG. 2A and a conventional delay line. The simulated DLL 20 had thickness $H_1$ of $0.3\lambda$ and thickness $H_2$ of $0.4\lambda$. FIG. 3A is a graph of transmittance and insertion loss parameters. FIG. 3A indicates a passband of about 1 GHz. FIG. 3B is a graph of group delay. FIG. 3B indicates dispersion in the DLL 20 and no dispersion in the conventional delay line. In FIG. 3B, the group delay ranges from about 25 ns to about 50 ns in the passband for the DLL 20. The change in group delay over the passband for the DLL 20 indicates dispersion. The simulation indicates a delay time dispersion from 25 ns to 50 ns with a passband of about 1 GHz at an operating frequency of 8 GHz for the DLL 20. By contrast, there is no dispersion indicated in FIG. 3B for the conventional delay line as the delay time is generally constant at about 25 ns.

Figure 4:
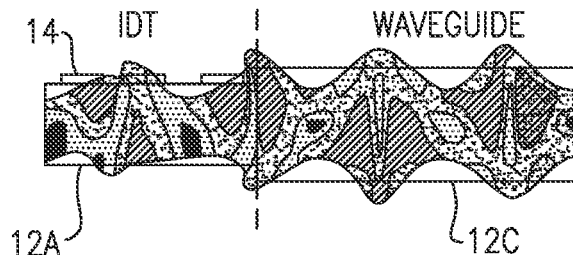
FIG. 4 illustrates a S0 Lamb wave mode at a boundary between a wave source and the waveguide in a schematic cross section corresponding to FIG. 2.

FIG. 4 illustrates a S0 mode at a boundary between a wave source (IDT electrode) and the waveguide in a schematic cross section corresponding to FIG. 2. FIG. 4 can correspond to an operating frequency of 8 GHz. FIG. 4 indicates that there is relatively low distortion for the S0 Lamb wave at the boundary of the Lamb wave element and the waveguide, where the Lamb wave element includes the IDT electrode 14 and the region 12A of the piezoelectric substrate.

Figure 5:
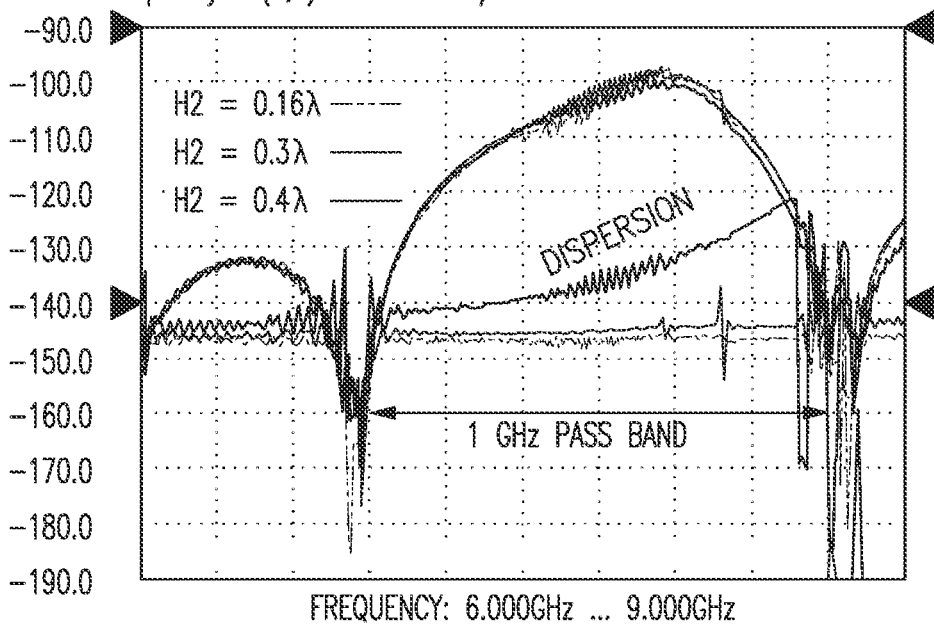
FIG. 5 is a graph that shows dispersion in a delay line with a waveguide that is thicker than a thin plate and no dispersion when the waveguide is the same thickness or thinner than the thickness of a substrate across an interdigital transducer (IDT) electrode.

FIG. 5 is a graph that shows dispersion in a delay line with a waveguide that is thicker than a thin plate and no significant dispersion when the waveguide is the same thickness or thinner than the thin plate. Various thicknesses $H_2$ of the waveguide for a delay line that is generally similar in structure to the DLL 10A of FIG. 1A were simulated. The three curves in FIG. 5 correspond to the waveguide region 12C having thickness $H_2$ of $0.16\lambda$, $0.3\lambda$, and $0.4\lambda$ with the thin plate region 12A, 12B having thickness $H_1$ of $0.3\lambda$ in each of the simulations. FIG. 5 indicates no group delay dispersion for thickness $H_2$ that is less than (e.g., $0.16\lambda$) or equal to (e.g., $0.3\lambda$) thickness $H_1$. For a thickness $H_2$ (e.g., $0.4\lambda$) that is greater than $H_1$, FIG. 5 indicates group delay dispersion.

FIG. 5 indicates that there can be dispersion when the waveguide thickness is greater than the thin plate thickness. When the thickness $H_2$ is greater than $H_1$, Lamb wave group velocity dispersion is indicated. If waveguide thickness is great than $0.5\lambda$, the Lamb wave shape can changes due to relatively high losses that can occur at the boundary with different acoustic impedance. Accordingly, the waveguide region thickness $H_2$ can be (1) greater than the thin plate region thickness $H_1$ and (2) less than $0.5\lambda$ for dispersion to occur in the DLL 10.

While FIG. 5 shows how thickness of a piezoelectric waveguide can impact dispersion, a DLL can alternatively or additionally be implemented with other structural features that can cause dispersion. For example, additional material (e.g., silicon dioxide, gallium nitride, silicon nitride) can be included on at least one side of the waveguide to alter the wave propagation velocity. This can create group delay dispersion.

In addition, although FIG. 5 includes curves corresponding to constant thickness piezoelectric waveguides, a piezoelectric waveguide can have any suitable profile to create a DLL. Example profiles include stepped region (e.g., as shown in FIGS. 1D and 1E) and sloped or tapered regions (e.g., as shown in FIG. 1C).

DLLs disclosed herein can achieve a relatively high delay time, such as about 50 ns. DLLs disclosed herein can be implemented in high frequency applications. DLLs disclosed herein are suitable for 5G applications and/or applications with a frequency over 10 GHz. DLLs disclosed herein can be used in applications with frequencies of 20 GHz or higher. DLLs can be used for 5G applications in Frequency Range 2 (FR2). DLLs disclosed herein can achieve a relatively wide frequency range, such as passband over 0.5 GHz, over 1 GHz, in a range from 0.5 GHz to 2 GHz, etc. At the same time, there can be relatively low losses. This can be due to low acoustical dumping in thin plate Lamb wave structures. Delay time and dispersion characteristic can be controlled via propagation length ($L_{SP}$) and thickness of the waveguide ($H_2$), respectively. The propagation length can adjust the delay time. The slope of the dispersion characteristic can be adjusted by changing waveguide thickness. In certain applications, the dispersion characteristic can be linearized through some or all of a passband of a dispersive delay line.

Figure 6:
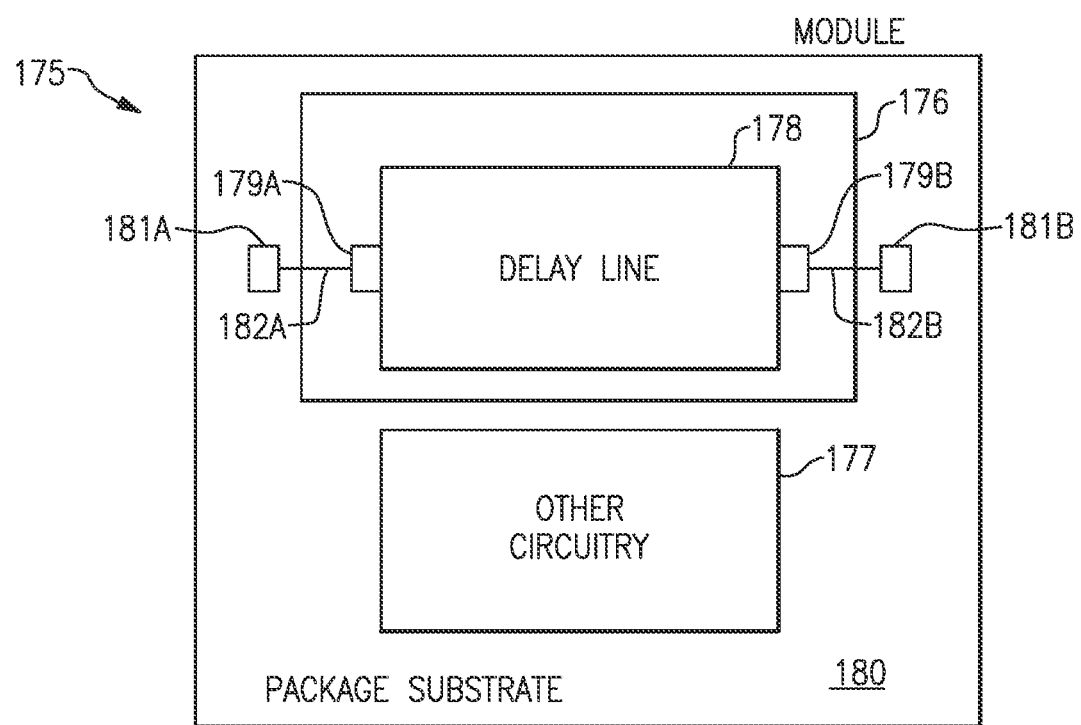
FIG. 6 is schematic block diagram of an illustrative packaged module according to an embodiment.

DLLs disclosed herein can be implemented in radio frequency modules. FIG. 6 is a schematic diagram of a radio frequency module 175 that includes an acoustic wave component 176 according to an embodiment. The illustrated radio frequency module 175 includes the acoustic wave component 176 and other circuitry 177. The acoustic wave component 176 includes a dispersive delay line 178 implemented in accordance with any suitable principles and advantages disclosed herein. The terminals 179A and 179B can serve, for example, as an input contact and an output contact.

The acoustic wave component 176 and the other circuitry 177 are on a common packaging substrate 180 in FIG. 6. The packaging substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry 177 can include one or more one or more power amplifiers, one or more radio frequency switches, one or more filters, one or more low noise amplifiers, other radio frequency circuitry, the like, or any suitable combination thereof. Power amplifiers and low noise amplifiers are examples of radio frequency amplifiers. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 7:
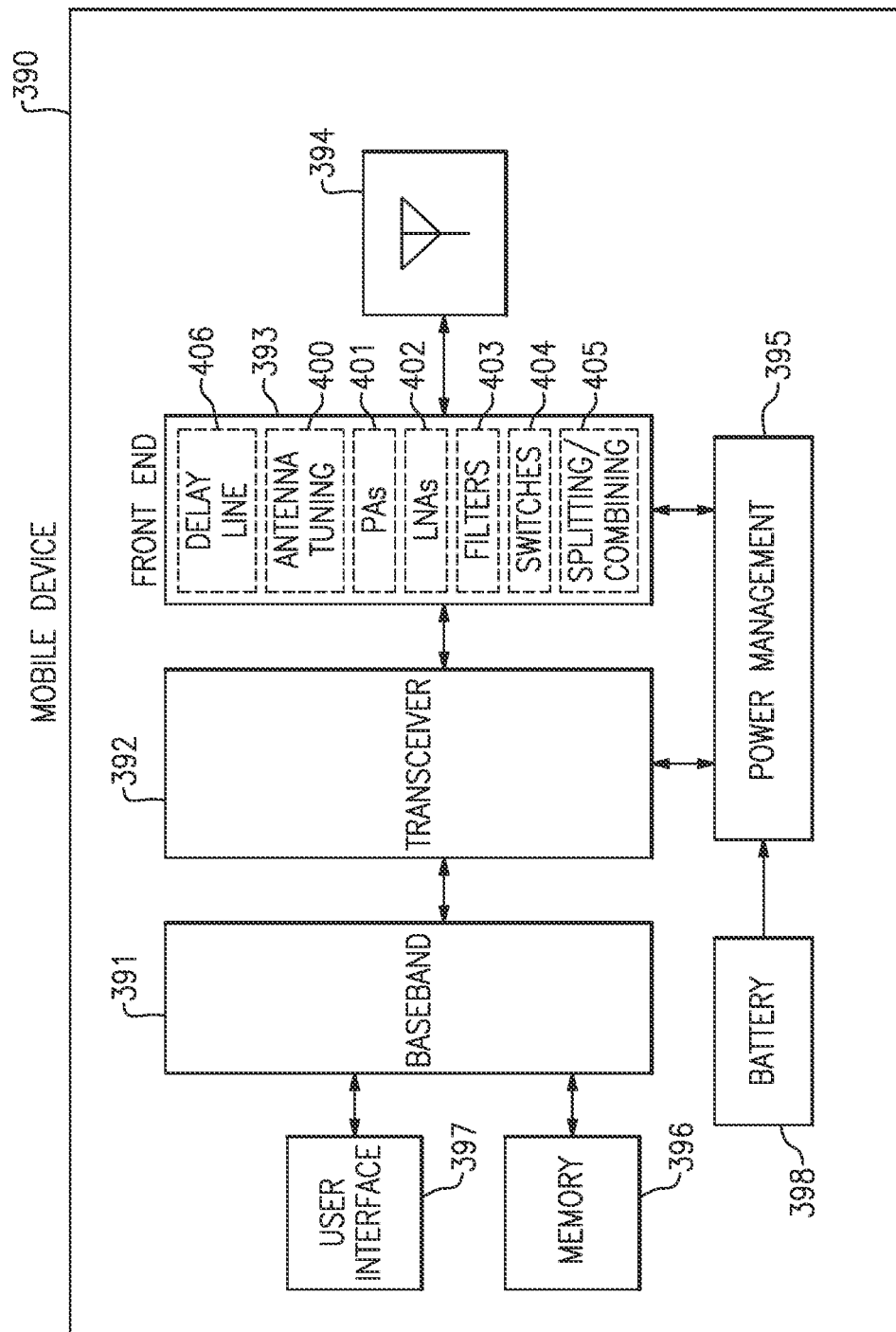
FIG. 7 is a schematic diagram of one embodiment of a mobile device.

DLLs disclosed herein can be implemented in a variety of wireless communication devices, such as mobile devices. Such mobile devices can include mobile phones, such as smart phones. The DLLs can be included in radio frequency circuitry of the wireless communication device, such as circuitry of a radio frequency front end. FIG. 7 is a schematic diagram of one embodiment of a mobile device 390. The mobile device 390 includes a baseband system 391, a transceiver 392, a front end system 393, antennas 394, a power management system 395, a memory 396, a user interface 397, and a battery 398. A DLL can be implemented in any suitable transmit circuitry of the mobile device 390. A DLL can be implemented in any suitable receive circuitry of the mobile device 390. For example, a delay line 406 of the front end system 393 can be implemented in accordance with any suitable principles and advantages disclosed herein. A DLL can provide passive modulation. A DLL can provide passive demodulation. A DLL can provide frequency compression.

The mobile device 390 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 392 generates RF signals for transmission and processes incoming RF signals received from the antennas 394. It will be understood that various functionalities associated with the transmission and receiving of RF signals can be achieved by one or more components that are collectively represented in FIG. 7 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAs) 401, low noise amplifiers (LNAs) 402, filters 403, switches 404, signal splitting/combining circuitry 405, and one or more delay lines 406. However, other implementations are possible.

The front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any suitable combination thereof. The delay line 406 can be a DLL that includes any suitable combination of features of the DLLs disclosed herein.

In certain implementations, the mobile device 390 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 7, the baseband system 391 is coupled to the memory 396 to facilitate operation of the mobile device 390.

The memory 396 can be used for a wide variety of purposes, such as storing data and/or instructions to facilitate the operation of the mobile device 390 and/or to provide storage of user information.

The power management system 395 provides a number of power management functions of the mobile device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 7, the power management system 395 receives a battery voltage from the battery 398. The battery 398 can be any suitable battery for use in the mobile device 390, including, for example, a lithium-ion battery.

The 3rd Generation Partnership Project (3GPP) introduced Phase 1 of fifth generation (5G) technology in Release 15, and is currently in the process of developing Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. DLLs disclosed herein can be implemented in relatively high frequency applications, for example, for modulating and/or demodulating FM signals.

Figure 8:
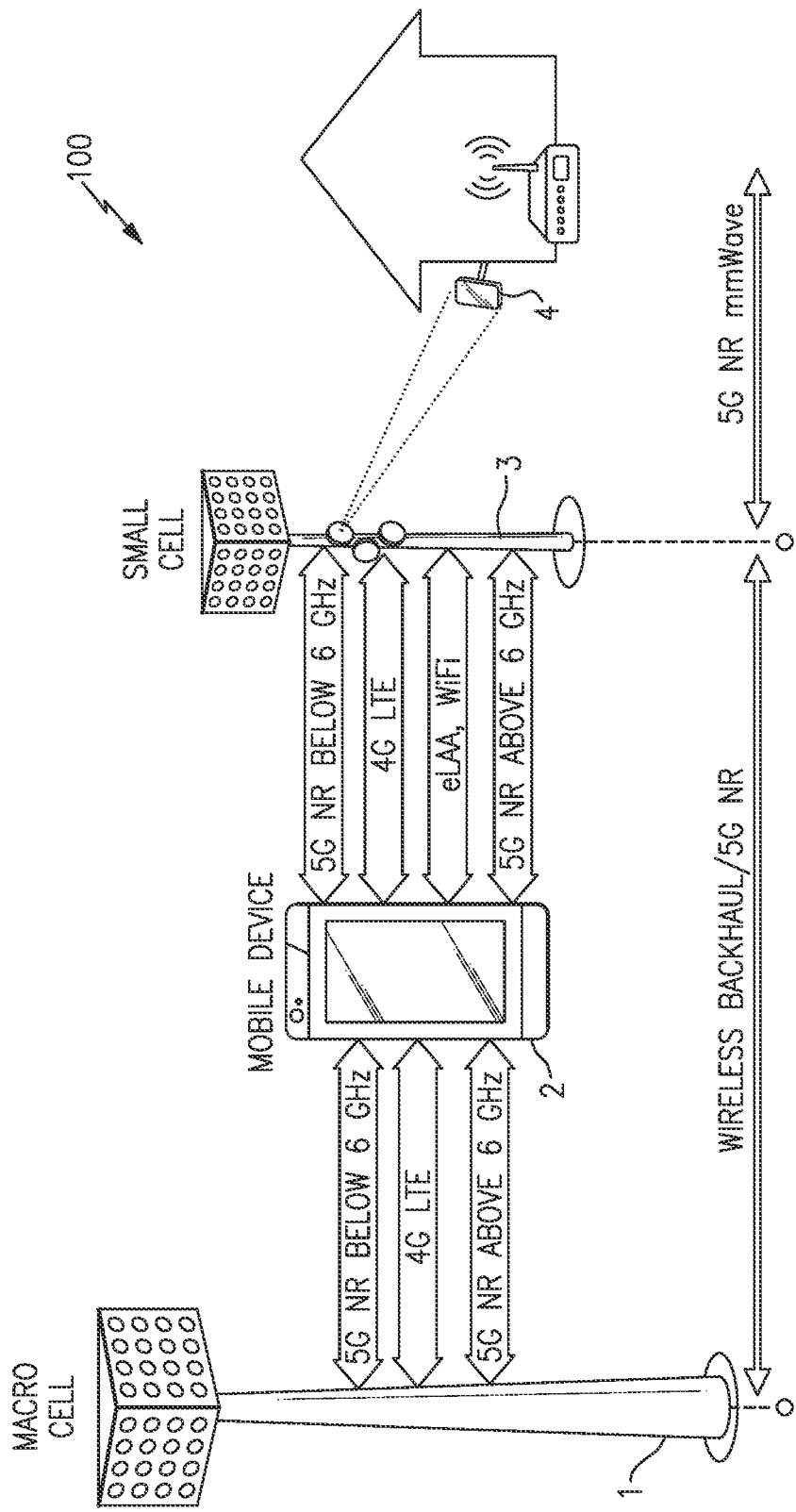
FIG. 8 is a schematic diagram of one example of a communication network.

FIG. 8 is a schematic diagram of one example of a communication network 100. The communication network 100 includes a macro cell base station 1, a mobile device 2, a small cell base station 3, and a stationary wireless device 4. Any device or components in the communication network 100 can include a DLL in accordance with any suitable principles and advantages disclosed herein.

The illustrated communication network 100 of FIG. 8 supports communications using a variety of technologies, including, for example, 4G LTE, 5G NR, and wireless local area network (WLAN), such as Wi-Fi. In the communication network 100, dual connectivity can be implemented with concurrent 4G LTE and 5G NR communication with the mobile device 2. Although various examples of supported communication technologies are shown, the communication network 100 can be adapted to support a wide variety of communication technologies.

Various communication links of the communication network 100 have been depicted in FIG. 8. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 8, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 1 and the small cell base station 3 using 5G NR technology over one or more frequency bands that within Frequency Range 1 (FR1) and/or over one or more frequency bands that are above FR1. The one or more frequency bands within FR1 can be less than 6 GHz. For example, wireless communications can utilize FR1, Frequency Range 2 (FR2), or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 100 of FIG. 8 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 100 is illustrated as including two base stations, the communication network 100 can be implemented to include more or fewer base stations and/or base stations of other types. As shown in FIG. 8, base stations can communicate with one another using wireless communications to provide a wireless backhaul. Additionally or alternatively, base stations can communicate with one another using wired and/or optical links.

The communication network 100 of FIG. 8 is illustrated as including one mobile device and one stationary wireless device. The mobile device 2 and the stationary wireless device 4 illustrate two examples of user devices or user equipment (UE). Although the communication network 100 is illustrated as including two user devices, the communication network 100 can be used to communicate with more or fewer user devices and/or user devices of other types. For example, user devices can include mobile phones, tablets, laptops, IoT devices, wearable electronics, and/or a wide variety of other communications devices.

User devices of the communication network 100 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 100 of FIG. 8 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 3 GHz to 20 GHz or in a frequency range from about 10 GHz to 60 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators described herein may be embodied in a variety of other forms. Furthermore, various omissions, substitutions and changes in the form of the resonators described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A dispersive delay line comprising:
a piezoelectric substrate including a first region, a second region, and a third region;
a first interdigital transducer electrode on the first region of the piezoelectric substrate;
a second interdigital transducer electrode on the second region of the piezoelectric substrate; and
an additional material on the third region of the piezoelectric substrate, the additional material configured to adjust acoustic wave propagation velocity in the third region of the piezoelectric substrate, the dispersive delay line arranged such that a Lamb wave of wavelength λ is configured to propagate from the first interdigital transducer electrode to the second interdigital transducer electrode though the third region of the piezoelectric substrate with a group delay that depends on frequency.

2. The dispersive delay line of claim 1 wherein the additional material is positioned on both a top surface and a bottom surface of the piezoelectric substrate in the third region.

3. The dispersive delay line of claim 1 wherein the additional material includes silicon dioxide.

4. The dispersive delay line of claim 1 wherein the additional material includes gallium nitride.

5. The dispersive delay line of claim 1 wherein the additional material includes silicon nitride.

6. The dispersive delay line of claim 1 wherein the piezoelectric substrate has a substantially constant thickness in the first region, the second region, and the third region.

7. The dispersive delay line of claim 1 wherein the group delay has a non-linear relationship with frequency.

8. The dispersive delay line of claim 1 wherein the group delay has a linear relationship with frequency.

9. The dispersive delay line of claim 1 wherein the dispersive delay line has a passband bandwidth in a range from 0.5 gigahertz to 2 gigahertz.

10. The dispersive delay line of claim 1 wherein the dispersive delay line has a passband bandwidth of more than 1 gigahertz.

11. The dispersive delay line of claim 1 wherein the group delay is in a range from 20 nanoseconds to 100 nanoseconds.

12. The dispersive delay line of claim 1 wherein the dispersive delay line has an operating frequency in range from 5 gigahertz to 10 gigahertz.

13. The dispersive delay line of claim 1 wherein the dispersive delay line has an operating frequency in Frequency Range 2 defined by a New Radio standard.

14. The dispersive delay line of claim 1 wherein the piezoelectric substrate includes aluminum nitride.

15. The dispersive delay line of claim 14 wherein the Lamb wave is a lowest order symmetric mode Lamb wave.

16. The dispersive delay line of claim 1 wherein the Lamb wave is a lowest order symmetric mode Lamb wave.

17. A radio frequency module comprising:
a dispersive delay line including a piezoelectric substrate, a first interdigital transducer electrode on a first region of the piezoelectric substrate, a second interdigital transducer electrode on a second region of the piezoelectric substrate, and an additional material on a third region of the piezoelectric substrate, the additional material configured to adjust acoustic wave propagation velocity in the third region of the piezoelectric substrate, the dispersive delay line arranged such that a Lamb wave of wavelength $\lambda$ is configured to propagate from the first interdigital transducer electrode to the second interdigital transducer electrode though the third region of the piezoelectric substrate with a group delay that depends on frequency;
a radio frequency circuitry coupled to the dispersive delay line; and
packaging structure enclosing the dispersive delay line and the radio frequency circuitry.

18. The radio frequency module of claim 17 wherein the radio frequency circuitry includes a radio frequency amplifier.

19. A wireless communication device comprising:
a dispersive delay line including a piezoelectric substrate, a first interdigital transducer electrode on a first region of the piezoelectric substrate, a second interdigital transducer electrode on a second region of the piezoelectric substrate, and an additional material on a third region of the piezoelectric substrate, the additional material configured to adjust acoustic wave propagation velocity in the third region of the piezoelectric substrate, the dispersive delay line arranged such that a Lamb wave of wavelength $\lambda$ is configured to propagate from the first interdigital transducer electrode to the second interdigital transducer electrode though the third region of the piezoelectric substrate with a group delay that depends on frequency; and
an antenna in communication with the dispersive delay line.

20. The wireless communication device of claim 19 wherein the wireless communication device is a mobile phone.

* * * * *